United States Patent [19]
Pramanick et al.

[11] Patent Number: 5,617,991
[45] Date of Patent: Apr. 8, 1997

[54] METHOD FOR ELECTRICALLY CONDUCTIVE METAL-TO-METAL BONDING

[75] Inventors: Shekhar Pramanick, Fremont; Deepak Nayak, Santa Clara, both of Calif.

[73] Assignee: Advanced Micro Devices, Inc., Sunnyvale, Calif.

[21] Appl. No.: 566,070

[22] Filed: Dec. 1, 1995

[51] Int. Cl.⁶ .................................................. H01L 21/50
[52] U.S. Cl. .................... 228/180.22; 228/193; 228/208; 438/683
[58] Field of Search ............................... 228/123.1, 190, 228/194, 208, 180.22; 437/192; 257/763, 737

[56] References Cited

U.S. PATENT DOCUMENTS 4,244,002  1/1981  Sato et al. ............................... 257/737
5,134,460  7/1992  Brady et al. ............................. 257/737

*Primary Examiner*—Samuel M. Heinrich
*Attorney, Agent, or Firm*—Douglas A. Chaikin, Esq.; Peninsula IP Group

[57] ABSTRACT

Disclosed herein is a method for electrically conductive metal-to-metal bonding. The method for bonding flat metal surfaces comprises the steps of depositing a thin layer of titanium on a first surface of a first metal surface, placing the first surface of the first metal surface in contact with a first surface of a second metal surface in an inert ambiance, heating the inert ambiance to a temperature substantially below the melting point of the metal surfaces, and forming a titanium metal bond between the first metal surface and the second metal surface to provide a low resistive path between the first metal surface and the second metal surface.

22 Claims, 5 Drawing Sheets

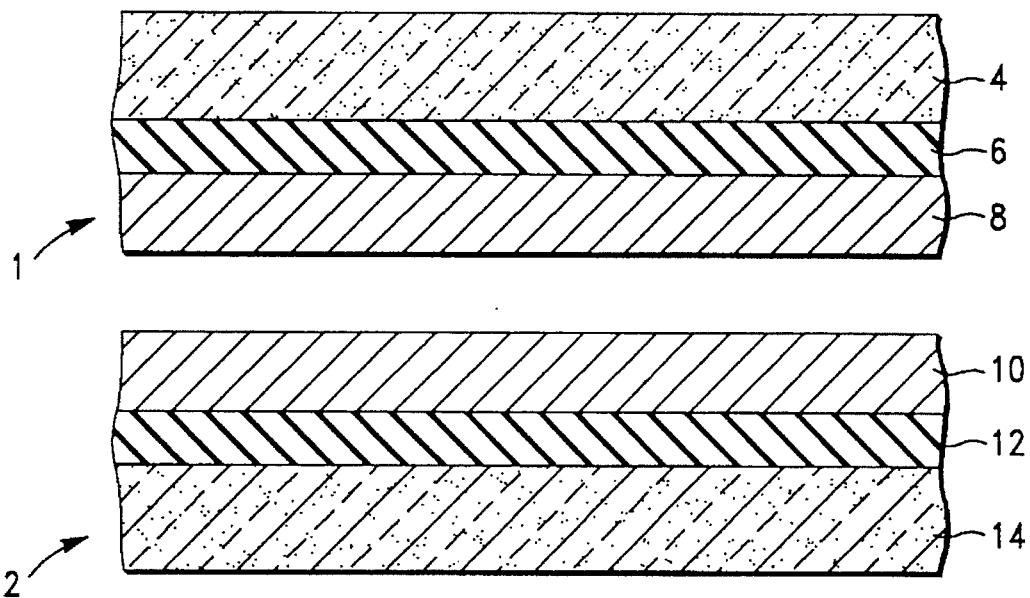
*FIG.—1*
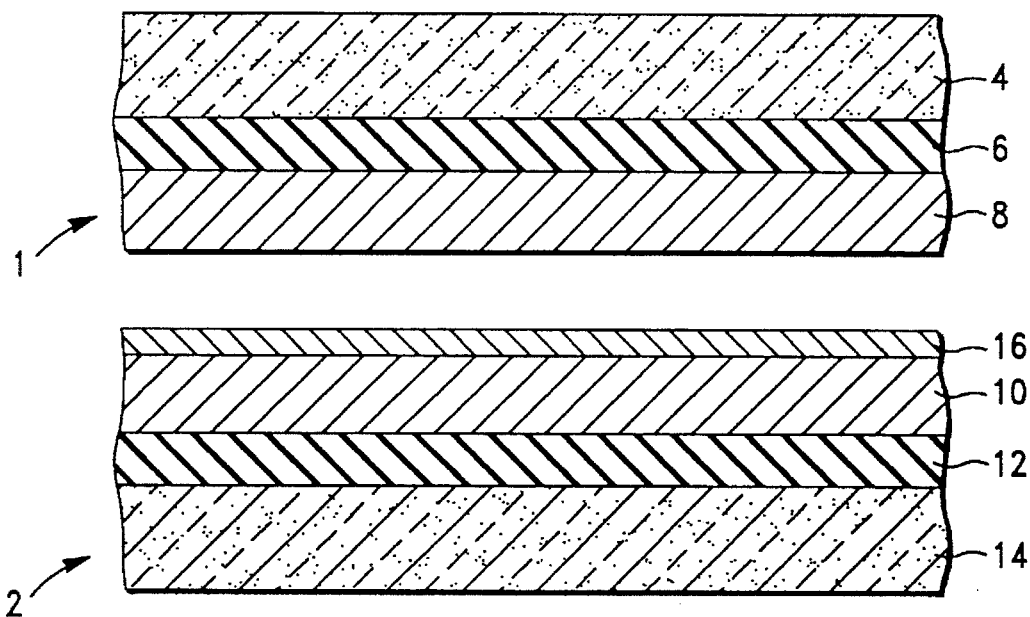
*FIG.—2*

METHOD FOR ELECTRICALLY CONDUCTIVE METAL-TO-METAL BONDING

BACKGROUND OF THE INVENTION

1. Field of the Invention

The present invention relates to interconnecting multichip modules and more particularly to forming electrically conductive metal bonds between integrated circuit devices.

2. Description of Previous Art

As advances in processing technology allow ever increasing number of integrated components to be fabricated on an integrated circuit (IC), The industry is constantly striving to integrate more circuit devices for each packaged integrated circuit.

Often times, the speed at which a system can operate is limited by resistor-capacitor (RC) delay and crosstalk coupling of one signal into another. The RC delay and crosstalk coupling problems are even more prominent as IC devices becomes smaller.

One technique that allows more circuit devices and more performance from a packaged IC is through the use of multichip modules (MCMs) technology. MCMs integrates a plurality of individual modules of circuit devices formed on a single IC die. MCMs have the advantage of increasing yields of highly complex ICs by piecing a complex IC together with smaller IC components. In this way, defects that do occur effect individual components of the MCM rather than a single large complex die. Defects affecting the larger dies are much more costly.

The IC modules of the MCM packages are bare ICs. Many of these ICs are fabricated on top of a monolithic silicon IC wafer and designed for perimeter wire bonding. Devices are first formed on the silicon IC wafer. Multiple metallization layers are formed on the bare IC to provide a connection medium from the IC to the outside world and within the IC. Aluminum is commonly used for the metallization layers because aluminum exhibits desirable properties such as ease of processing and low resistivity. The top most level metal is deposited and patterned during the last stages of processing, whereas the gates, contacts, and the metallization of the devices are formed during earlier stages. The top level metal is thick because it is a current carrier for the IC.

Many MCM designs have evolved and is continuing to develop. A basic MCM design has a structure having two or more IC modules electrically connected to an interconnect substrate. The interconnect substrate has patterns formed on multiple layers to provide the interconnects to the IC modules. The multiple layers are separated by dielectric to prevent shorting between the layers. Contacts formed on the IC modules and the interconnect substrate provide coupling points for first level connections which couple the IC modules to the interconnect substrate. Additional contacts formed on the interconnect substrate provide second level connection points which couple the interconnect substrate to external pins of the packaged MCM.

MCMs have fundamental advantages of increased speed, reduced number of external connections, and reduced overall size. The interconnects between the IC modules are substantially shorter than what would otherwise be traces on a printed circuit board. The short interconnects increase signal integrity and reduce crosstalk. The number of external connections to the packaged IC is also reduced. Signals between the IC modules of the MCM are interconnected within the MCM. Furthermore, the overall size of an MCM is reduced by integrating many IC modules into a single MCM package.

In order to achieve peak performance from a system of individual ICs, it is desirable to keep connections between the individual ICs as short a possible. Circuit speed on the bare IC level is the highest speed achievable for the IC. As soon as interconnects are introduced, circuit speed begins to suffer. In an MCM, it is advantageous to limit interconnects lengths between the ICs.

Wirebond and tape automated bonding (TAB) techniques are used to provide connections between the IC modules and the MCM substrate. These techniques use leads for carrying electrical signals from one IC module to another. Thus, wirebond and TAB techniques suffer from circuit speed degradation and crosstalk that are inherent in lead designs. Some MCM designs have addressed reduced interconnect lead problems by using a flip chip solder bump (FCSB) technology.

IBM first introduced the FCSB interconnections in 1964. FCSB interconnections are still widely practiced by IBM today. Bare ICs with solder bump terminals and a matching set of solder pads on a substrate are mated to produce interconnections between the ICs of the MCM. The ICs are placed upside down or flipped to mate with the substrate. In this way, interconnects between the IC modules are kept at a minimum. Solder bumps are used to attach the IC modules and the substrate. Each solder bump is aligned with it matching substrate pad. All the solder joints are processed simultaneously by reflowing the solder in a furnace.

There are however some disadvantages of the FCSB interconnections. The disadvantages arise from the connection medium between the flipped ICs and the underlying MCM substrate. The MCM substrate is typically much larger than the ICs. Multiple ICs are attached to the MCM substrate to form the MCM. The larger MCM substrates are more complex to build which reduces the yield of FCSB MCMs. Furthermore, because the MCM substrate functions to interconnect the IC modules, parasitic capacitance present in the larger and more complex substrate degrades electrical performance of the IC modules. Thus, FCSB interconnections adds cost and complexity to the fabrication of MCM modules.

Therefore, it is desirable to provide interconnects well suited for IC modules, and a method of operating the same which preserve bare IC circuit speed and performance without suffering from disadvantages of previous MCM designs.

SUMMARY OF THE INVENTION

The various objects of the invention which are presented and which will become apparent below are provided by example only and are not intended to limit the scope of the present invention. The present invention is to be limited in scope only by the appended claims.

It is an object of the present invention to bond top level metals of devices formed on a silicon substrate.

It is a further object to provide low resistive bonds between aluminum.

It is a further object to bond aluminum with aluminum in temperatures below the melting point of aluminum.

It is a further object to provide interconnects well suited IC modules.

It is a further object to reduce fanout of IC modules contained in MCMs.

It is a further object to provide three dimensional multichip structures.

It is a further object to provide MCMs that exhibit greater circuit speed.

In accordance with the above objects and those that will be mentioned and will become apparent below, a method for bonding flat metal surfaces comprising the steps of:

depositing a thin layer of titanium on a first surface of a first metal surface;

placing the first surface of the first metal surface in contact with a first surface of a second metal surface in an inert ambiance;

heating the inert ambiance to a temperature substantially below the melting point of the metal surfaces; and forming a titanium metal bond between the first metal surface and the second metal surface to provide a low resistive path between the first metal surface and the second metal surface.

According to one aspect of the invention, the method further comprises depositing a thin layer of titanium on the first surface of the second metal surface. The first flat metal surface and the second flat metal surface are top level metal surfaces of bare ICs which are formed with aluminum. Thus, a metal bond of $TiAl_3$ is formed between the metal surfaces. Aluminum exhibits desirable properties for use as a top level metal because of its ease of processing and low resistivity The top level metal of a bare IC provides a connection medium from the IC to the outside world and is deposited and patterned during the last stages of processing. As the top level metal, it is a current carrier and is therefore thick.

According to another aspect of the invention, the inert ambiance includes nitrogen and argon which is heated in a furnace to a temperature between 400° C. and 550° C. The first flat metal surface and the second flat metal surface are heated for about 15 to 20 minutes.

According to yet another aspect of the invention, the thin layer of titanium is approximately 250 angstroms.

A method of bonding a first metal surface and a second metal surface is provided which exhibits low resistivity. The method of bonding is performed at low processing temperatures in an inert ambiance. The method of bonding is applicable to aluminum and other conductive metals which are widely used for top level metals of bare ICs fabricated on silicon substrates. Thus, by bonding top level metals of bare ICs to form interconnects between the bare ICs, three dimensional MCMs that have smaller fanouts and offering greater circuit speed performance are realizable.

It is an advantage of the present invention to provide bonding of top level metals of devices formed on a silicon substrate.

It is a further advantage to provide low resistive bonds between aluminum.

It is a further advantage to bond aluminum with aluminum in temperatures below the melting point of aluminum.

It is a further advantage to provide interconnects well suited IC modules.

It is a further advantage to reduce fanout of IC modules contained in MCMs.

It is a further advantage to provide three dimensional multichip structures.

It is a further advantage to provide MCMs that exhibit greater circuit speed.

BRIEF DESCRIPTION OF THE DRAWINGS

FIG. 1 is a simplified cross sectional view of two silicon wafers.

FIG. 2 is a cross sectional view of two silicon wafers, the second wafer having a layer of titanium deposited according to the present invention.

DETAILED DESCRIPTION

Figure 3:
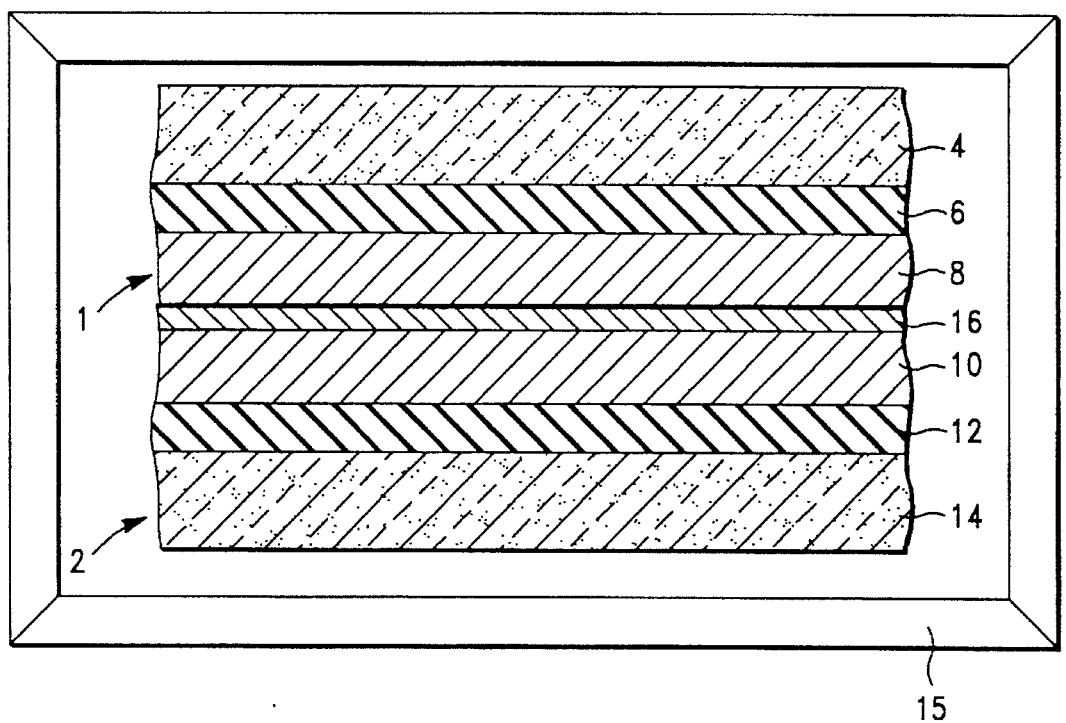
FIG. 3 is a cross sectional view of the two silicon wafers being bonded in a furnace being exposed to an inert ambiance.

A detailed description of preferred embodiments of the present invention is provided with respect to the drawings. Like characters refer to like elements throughout. FIG. 1 shows simplified layering of two silicon wafers 1 and 2. The silicon wafers 1 and 2 contain integrated circuits that have been formed using processes well known in the art. Wafer 1 includes a silicon (Si) layer 4, a silicon oxide layer 6, and an aluminum (Al) layer 8. Many devices are formed on the silicon layer 4. The silicon oxide layer 6 provides insulation between the devices formed on the silicon layer 4 and the aluminum layer 8. The aluminum layer 8 is a metal layer that provides interconnections for the devices formed on the silicon layer 4.

Wafer 2 is similar to wafer 1. Wafer 2 includes a silicon layer 14, a silicon oxide layer 12, and an aluminum layer 10. Many devices are formed on the silicon layer 14. The silicon oxide layer 12 provides insulation between the devices formed on the silicon layer 14 and the aluminum layer 10. The aluminum layer 10 is a metal layer that provides interconnections for the devices formed on the silicon layer 14.

With respect to FIG. 2, there is shown a titanium (Ti) layer 16 that is formed on the aluminum layer 10 of wafer 2. Metallization of the titanium layer 16 onto the aluminum 10 of wafer 2 is well known in the art. One technique to perform the metallization is to use a process known as physical vapor deposition (PVD). Other deposition processes can also be used. The processes include deposition of films by thermal evaporation and sputter deposition. Approximately 250 angstroms of titanium are deposited onto the aluminum layer 10. Prior to deposition, care is taken to remove aluminum oxide that may have formed on the aluminum surface. Additionally, after deposition of the titanium, care is taken to prevent oxidation of the titanium. Any exposure of the titanium to air can cause oxidation.

Referring to FIG. 3, the aluminum layer 8 of wafer 1 and the titanium layer 16 of wafer 2 are brought in physical contact and pressed together to maintain the physical contact between the wafers. The wafers 1 and 2 are placed in a furnace 15 and furnace annealed at a temperature in the range of approximately 400° C. to 550° C. for 15–20 minutes in an inert ambiance. Care is taken to evacuate any oxygen from the inert ambiance of the furnace 15. The inert ambiance may be Nitrogen or Argon, for example. During the annealing process, the titanium layer 16 reacts with the aluminum layers 8 and 10 to form the $TiAl_3$ intermetallic compound between the aluminum layers. The Ti—Al bonds provides the intermetallic compound having a resistivity of approximately 30 $\mu\Omega$-cm. The intermetallic compound Ti—Al affords a low resistivity path for the interconnects between the integrated circuits of wafer 1 and wafer 2.

Although Aluminum is presented throughout as the top layer of the wafers in the various embodiments, other top layer metallization metals may be used. For example, if copper is used as the top layer of wafers, a layer of titanium is deposited to the copper for bonding copper top layers of wafers together. If titanium is used as the top layer of wafers, the titanium top layers can also be bonded to provide the low resistive bonds.

By properly patterning the aluminum layer 8 and 10, electrically conductive connections between wafer 1 and wafer 2 are formed. These electrically conductive connections provide low resistive IC level interconnects that allow peak circuit from the interconnected devices of wafer 1 and wafer 2.

Figure 4:
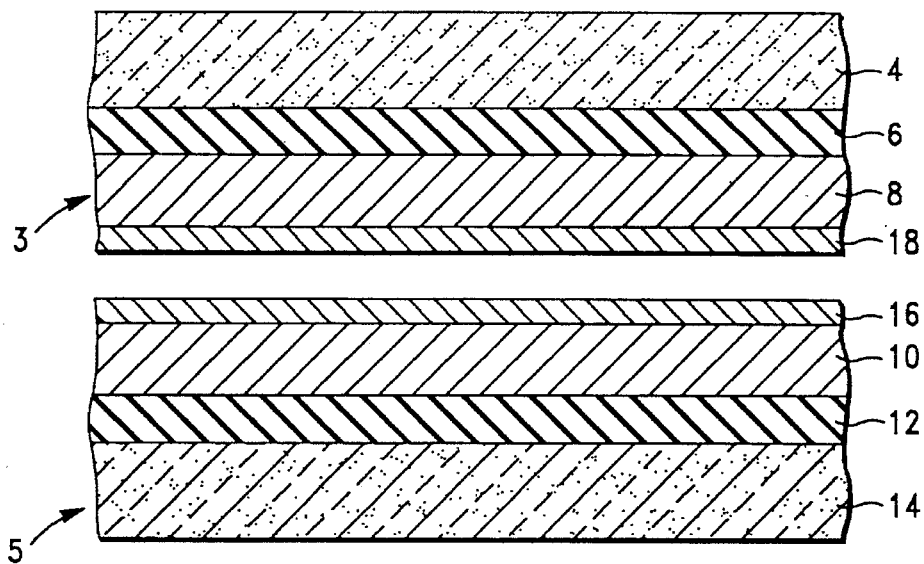
FIG. 4 is a cross sectional view of two silicon wafers having a layer of titanium deposited according to an alternative embodiment of the present invention.

In a second embodiment, FIG. 4 shows that wafer 3 is also deposited with a titanium layer 18. The deposited titanium layer 18 is approximately 250 angstroms. Similar deposition techniques used for the deposition of the titanium layer 16 of wafer 4 in FIG. 2 can also be applied to wafer 3. Thus, wafer 3 includes the silicon (Si) layer 4, the silicon oxide layer 6, and the aluminum (Al) layer 8. Many devices are formed on the silicon layer 4. The silicon oxide layer 6 provides insulation between the devices formed on the silicon layer 4 and the aluminum layer 8. The aluminum layer 8 is the metal layer that provides interconnections for the devices formed on the silicon layer 4. Wafer 5 similar to the wafer 2 of FIG. 2 includes the titanium layer 16, the silicon layer 14, the silicon oxide layer 12, and the aluminum layer 10. Many devices are formed on the silicon layer 14. The silicon oxide layer 12 provides insulation between the devices formed on the silicon layer 14 and the aluminum layer 10. The aluminum layer 10 is the metal layer that provides interconnections for the integrated circuits formed on the silicon layer 4.

Figure 5:
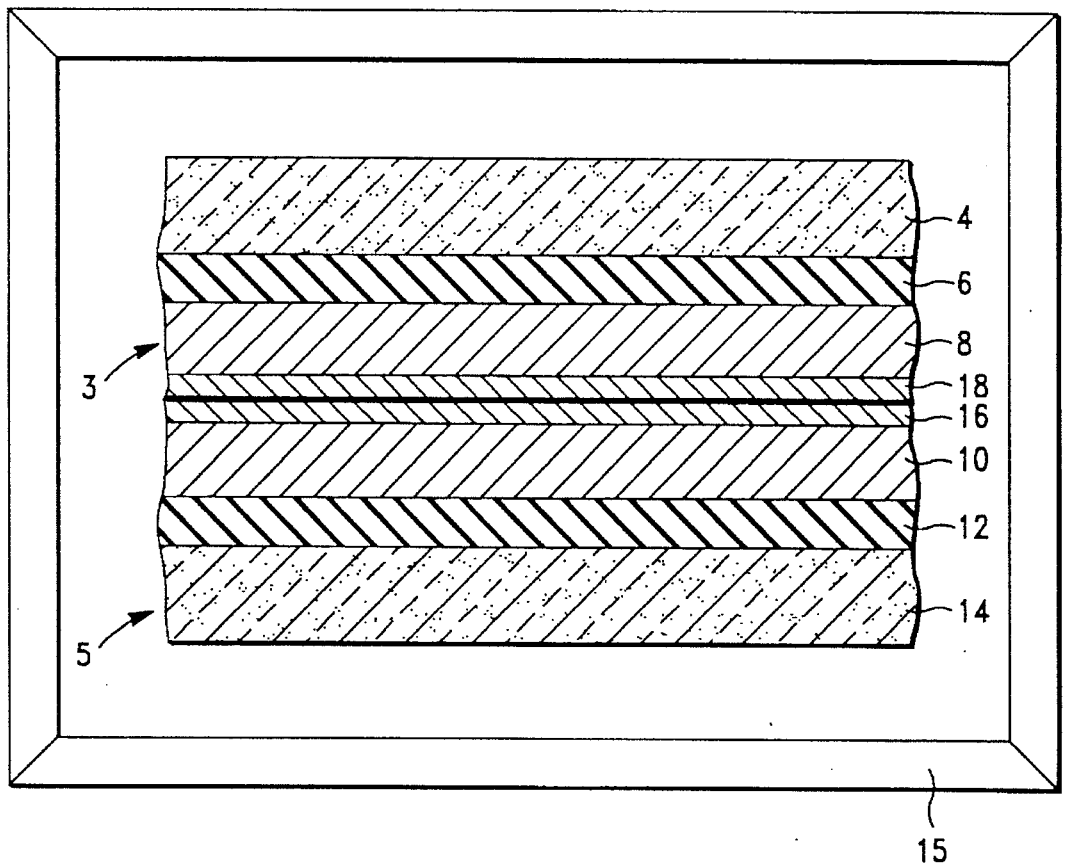
FIG. 5 is a cross sectional view of the two silicon wafers being bonded in a furnace being exposed to an inert ambiance according to an alternative embodiment of the present invention.

With respect to FIG. 5, there is shown that the titanium layer 18 of wafer 3 and the titanium layer 16 of wafer 5 are brought in physical contact and pressed together. The wafers 3 and 5 are placed in the furnace 15 and furnace annealed at a temperature in the range of approximately 400° C. to 550° C. for 15–20 minutes in an inert ambiance in the absence of oxygen. The inert ambiance may be Nitrogen or Argon, for example. During the annealing process, the titanium layer 16 and titanium layer 18 react with the aluminum layers 8 and 10 to form Ti—Al bonds between the aluminum layers. The Ti—Al bonds provides an intermetallic compound having a resistivity of approximately 30 $\mu\Omega$-cm. The intermetallic compound Ti—Al affords a low resistivity path for the interconnects between the integrated circuits of wafer 3 and wafer 5.

By properly patterning the aluminum layer 8 and 10, electrically conductive connections between wafer 3 and wafer 5 are formed. These electrically conductive connections provide low resistive IC level interconnects that allow peak circuit speed from the interconnected devices of wafer 3 and wafer 5.

Figure 6:
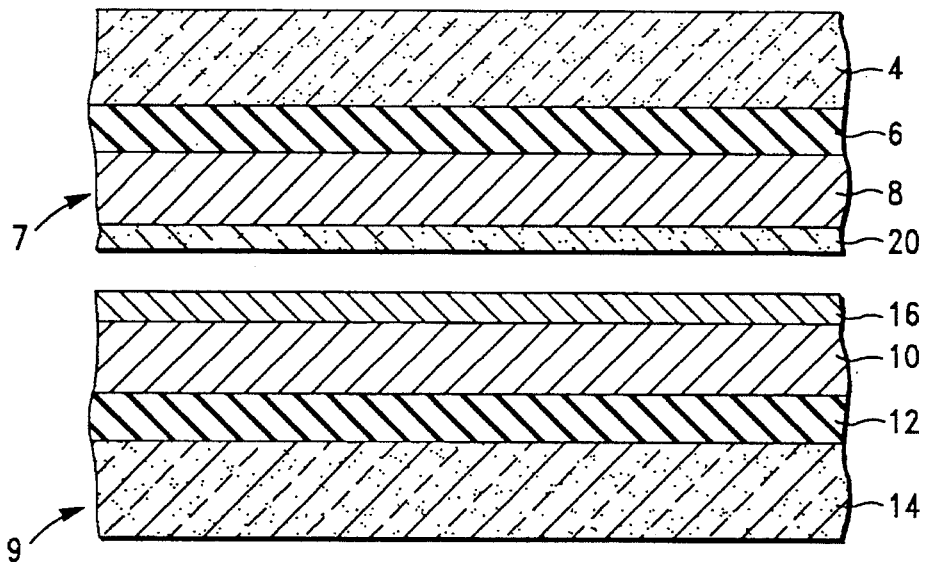
FIG. 6 is a cross sectional view of a first wafer having a silicon layer deposited and a second wafer having titanium deposited according to an alternative embodiment of the present invention.

In another embodiment, aluminum alloys are used to form a low resistive bond between wafer 7 and wafer 9. FIG. 6 shows a wafer 7 having approximately 400 angstroms of a silicon layer 20 deposited onto the aluminum layer 8. Wafer 9 has approximately 500 angstroms of a titanium 16 deposited onto the aluminum. Thus, wafer 7 includes the silicon (Si) layer 4, the silicon oxide layer 6, and the aluminum (Al) layer 8. Many devices are formed on the silicon layer 4. The silicon oxide layer 6 provides insulation between the devices formed on the silicon layer 4 and the aluminum layer 8. The aluminum layer 8 is the metal layer that provides interconnections for the devices formed on the silicon layer 4. Wafer 9 being similar to wafer 7 also includes the silicon layer 14, the silicon oxide layer 12, and the aluminum layer 10. Many devices are formed on the silicon layer 14. The silicon oxide layer 12 provides insulation between devices formed on the silicon layer 14 and the aluminum layer 10. The aluminum layer 10 provides interconnections for the integrated circuits formed on the silicon layer 4.

Figure 7:
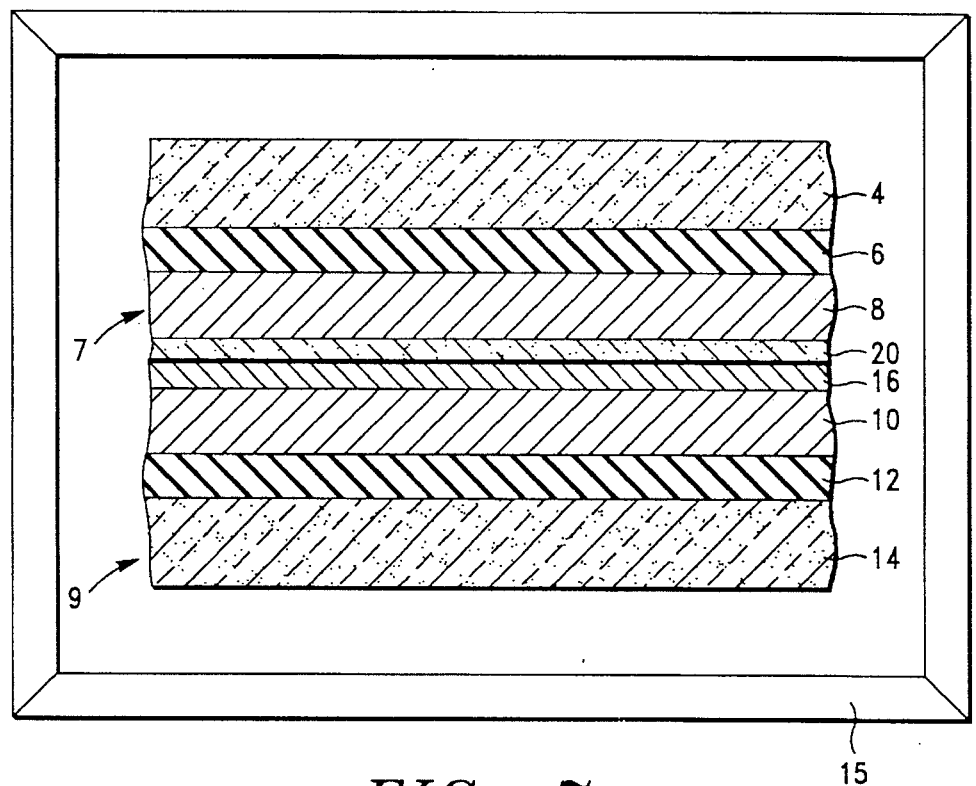
FIG. 7 is a cross sectional view of the two silicon wafers being bonded in a furnace being exposed to an inert ambiance according to an alternative embodiment of the present invention.

With respect to FIG. 7, there is shown that the silicon layer 20 of wafer 7 and the titanium layer 16 of wafer 9 are brought in physical contact and pressed together. In order to form a low resistive bond, a higher annealing budget is provided. The wafers 7 and 9 are placed in the furnace 15 and furnace annealed at a temperature of approximately 500° C. for approximately 30 minutes in an inert ambiance in the absence of oxygen. The inert ambiance may be Nitrogen or Argon, for example. During the annealing process, the titanium layer 16 reacts with the aluminum layers 8 and 10 to form Ti—Al and Ti—Si bonds between the aluminum layers. The Ti—Al and the Ti—Si bonds provide intermetallic compounds ($TiAl_3$, $Ti_xSi_y$, $TiAl_aSi_b$) having low resistivity that affords a low resistivity path for the interconnects between the integrated circuits of wafer 7 and wafer 9.

By properly patterning the aluminum layer 8 and 10, electrically conductive connections between wafer 7 and wafer 9 are formed. These electrically conductive connections provide low resistive IC level interconnects that allow peak circuit speed from the interconnected devices of wafer 7 and wafer 9.

Figure 8:
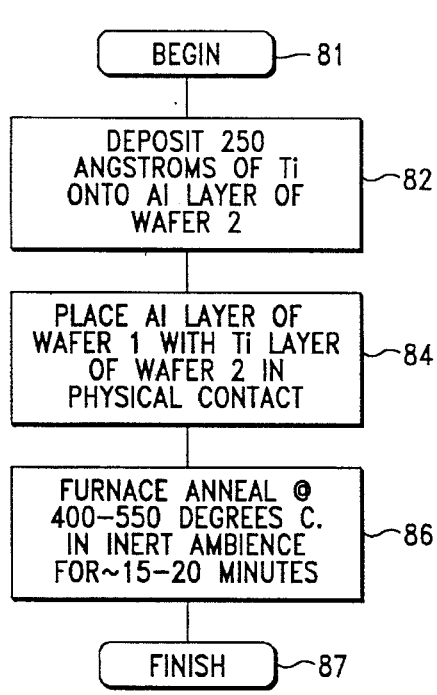
FIG. 8 is a flow diagram of aluminum to aluminum bonding according to the present invention.

FIG. 8 shows a flow diagram for bonding aluminum to achieve a low resistive bond according to the present invention. The flow diagram begins with step 81. Step 82 deposits 250 angstroms of titanium onto the aluminum layer of wafer 2. Next, step 84 places the aluminum layer of wafer 1 and the titanium layer of wafer 2 in physical contact. In step 86, wafer 1 and wafer 2 are furnace annealed at approximately 400° C. to 550° C. in an inert ambiance for approximately 15 to 20 minutes as needed to form the low resistive bond. The low resistive bond provides an electrically conductive bond between wafer 1 and wafer 2. The flow diagram is complete at finish step 87.

Figure 9:
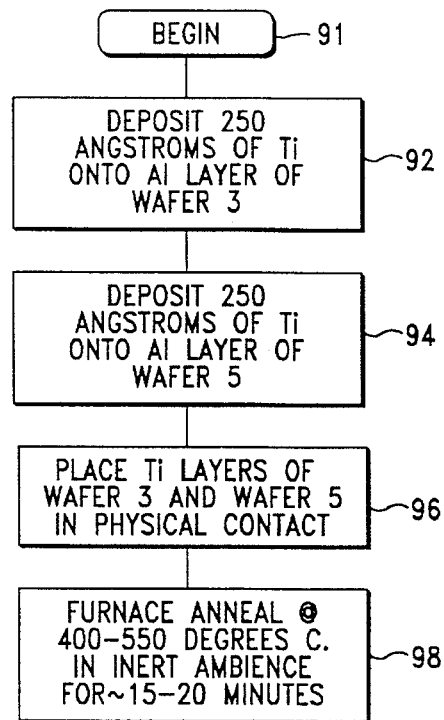
FIG. 9 is a flow diagram of aluminum to aluminum bonding according to an alternative embodiment of the present invention.

FIG. 9 shows a flow diagram of an alternative embodiment for bonding aluminum to achieve a low resistive bond according to the present invention. The flow diagram begins with step 91. Step 92 deposits 250 angstroms of titanium onto the aluminum layer of wafer 3. Step 94 deposits 250 angstroms of titanium onto the aluminum layer of wafer 5. Next, step 96 places the titanium layer of wafer 3 and the titanium layer of wafer 5 in physical contact. In step 98, wafer 3 and wafer 5 are furnace annealed at approximately 400° C. to 550° C. in an inert ambiance for approximately 15 to 20 minutes to form the low resistive bond. The low resistive bond provides an electrically conductive bond between wafer 3 and wafer 5. The flow diagram is complete at finish step 99.

Figure 10:
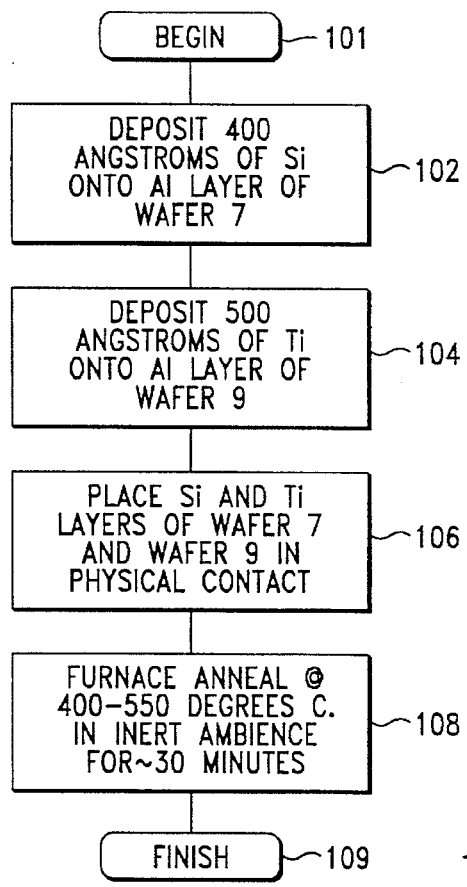
FIG. 10 is a flow diagram of bonding aluminum alloys according to an alternative embodiment of the present invention.

FIG. 10 shows a flow diagram of another alternative embodiment for bonding aluminum alloys to achieve a low resistive bond according to the present invention. The flow diagram begins with step 101. Step 102 deposits 400 angstroms of silicon onto the aluminum layer of wafer 7. Step 104 deposits 500 angstroms of titanium onto the aluminum layer of wafer 9. Next, step 106 places the silicon layer of wafer 7 and the titanium layer of wafer 9 in physical contact. In step 108, wafer 7 and wafer 9 are furnace annealed at approximately 500° C. in an inert ambiance for approximately 30 minutes to form the low resistive bond. The low resistive bond provides an electrically conductive bond between wafer 7 and wafer 9. The flow diagram is complete at finish step 109.

Figure 11:
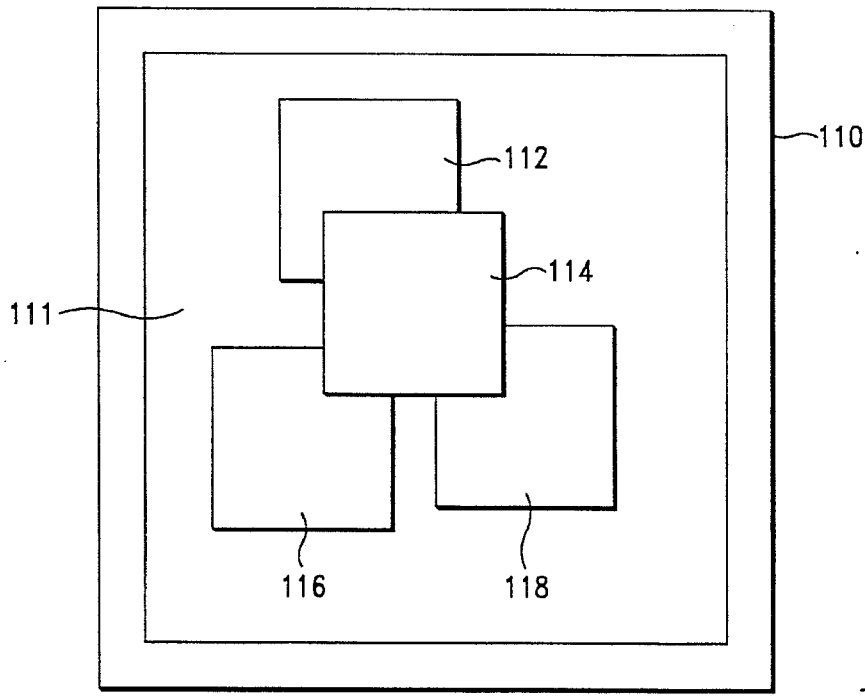
FIG. 11 shows a multichip module (MCM) having multiple modules interconnected with top level metals.

FIG. 11 shows a multichip module (MCM) having multiple modules interconnected with top level metals. MGM 110 includes integrated circuit (IC) modules 112, 114, 116, and 118 and a common substrate base 111. The common substrate base 111 provides interconnects for the modules 112, 114, 116, and 118. The IC modules 112, 114, 116, and 118 and the common substrate base 111 are interconnected to provide functionality to MCM 110. For simplicity, additional wirebond or TAB connections, external pins are not shown. The IC modules 112, 116, and 118 are coupled to the common substrate base 111. Die bond adhesives well known in the art is used to attach the IC modules 112, 116, and 118 to the substrate. The top level metal of the IC modules 112, 116, and 118 are coupled to the top level metal of module 114. Thus, the IC module 114 is flipped to allow the top level metal to couple with the top level metals of the IC modules 112, 116, and 118. In this way, a direct IC module connection between IC modules 114 and 112, 114 and 118, and 114 and 116 is achieved. Other variations of direct IC module connections are achievable depending on the system design. IC module designs optimized for direct IC module connections will rely more on interconnects using direct connection and rely less on interconnects between IC modules using wirebond and tape automated bonding (TAB) techniques for circuits which perform at higher circuit speeds.

By creating low resistive Al—Al bonds for electrically conductive bonds, the interconnects between multichip modules are directly bonded reducing interconnections through the use of interconnection substrates, wirebonds, and TAB techniques. Direct connections between top level metals offer stronger connections and shorter paths between the IC modules. The shorter paths between the IC modules reduce crosstalk between interconnects during high frequency operations. Thus, the overall system speed and performance of an MCM is increased.

Additionally, forming top level metal bonds between IC modules affords three dimensional configuration of IC modules. The stacking of the IC modules in the three dimensional configuration also reduces the overall footprint of the MCMs to provide more compactness.

The foregoing description of the preferred embodiments of the invention has been presented for purpose of illustration and description. It is not intended to be exhaustive or to limit the invention to the precise forms disclosed. Obviously, many modifications and variations will be apparent to the practitioners skilled in this art. It is intended that the scope of the invention be defined by the following claims and their equivalents.

What is claimed is:

1. A method for bonding flat metal surfaces comprising the steps of:

depositing a thin layer of titanium on a first surface of a first metal surface;

placing the first surface of the first metal surface in contact with a first surface of a second metal surface in an inert ambiance;

heating the inert ambiance to a temperature substantially below the melting point of the metal surfaces; and forming a titanium metal bond between the first metal surface and the second metal surface to provide a low resistive path between the first metal surface and the second metal surface.

2. The method according to claim 1 further comprising depositing a thin layer of titanium on the first surface of the second metal surface.

3. The method according to claim 1, wherein the first flat metal surface and the second flat metal surface includes aluminum.

4. The method according to claim 1, wherein the first flat metal surface and the second flat metal surface includes copper.

5. The method according to claim 1, wherein the inert ambiance includes nitrogen and argon.

6. The method according to claim 1, wherein the step of heating the inert ambiance includes the step of heating the inert ambiance to a temperature between 400° C. and 550° C.

7. The method according to claim 1, wherein the thin layer of titanium is approximately 250 angstroms.

8. A method of bonding aluminum surfaces comprising the steps of:

depositing a thin layer of titanium on a first surface of a first aluminum surface;

depositing a thin layer of silicon on a first surface of a second aluminum surface;

placing the first surface of the first aluminum surface in contact with the first surface of the second aluminum surface in an inert ambiance;

heating the inert ambiance to a temperature substantially below the melting point of the aluminum surfaces; and forming a metal bond between the first aluminum surface and the second aluminum surface to provide a low resistive path between the first aluminum surface and the second aluminum surface.

9. The method of bonding according to claim 8, wherein the thin layer of titanium is approximately 500 angstroms.

10. The method of bonding according to claim 8, wherein the thin layer silicon is approximately 400 angstroms.

11. The method of bonding according to claim 8, wherein the inert ambiance includes nitrogen and argon.

12. The method of bonding according to claim 8, wherein the step of heating the inert ambiance includes the step of heating the inert ambiance to a temperature between 400° C. and 550° C.

13. The method of bonding according to claim 8, wherein the step of forming a metal bond includes titanium-aluminum bonds and titanium-silicon bonds.

14. A method of bonding aluminum surfaces comprising the steps of:

depositing a thin layer of titanium on a first surface of a first aluminum surface;

depositing a thin layer of titanium on a first surface of a second aluminum surface;

placing the first surface of the first aluminum surface in contact with the first surface of the second aluminum surface in an inert ambiance;

heating the inert ambiance to a temperature substantially below the melting point of the aluminum surfaces; and forming a titanium-aluminum bond between the first aluminum surface and the second aluminum surface to provide a low resistive path between the first aluminum surface and the second aluminum surface.

15. A method of interconnecting multichip modules comprising the steps of:

depositing a thin layer of titanium on a first top level metal of a first module;

placing a second top level metal of a second module in contact with the first top level metal of the first module in an inert ambiance;

heating the inert ambiance to a temperature substantially below the melting point of the first top level metal and the second top level metal; and forming a titanium metal bond between the first top level metal of the first module and the second top level metal of the second module to provide a low resistive path between the first top level metal and the second top level metal.

16. The method of interconnecting according to claim 15, wherein:

the first top level metal includes patterns to provide connections to integrated circuits formed on the first module; and the second top level metal includes patterns to provide connections to integrated circuits formed on the second module.

17. The method of interconnecting according to claim 15, wherein the step of placing further comprises the step of flipping the second module to contact the second top level metal with the first top level metal of the first module.

18. The method of interconnecting according to claim 15, wherein the first top metal and the second metal are aluminum.

19. The method of interconnecting according to claim 18 further comprising depositing a thin layer of titanium on the second top level metal of the second module.

20. The method of interconnecting according to claim 19, wherein the thin layer of titanium deposited on the first top level metal and the second top level is approximately 250 angstroms.

21. The method of interconnecting according to claim 15, wherein the inert ambiance includes nitrogen and argon.

22. The method of interconnecting according to claim 15, wherein the step of heating the inert ambiance includes the step of heating the inert ambiance to a temperature between 400° C. and 550° C.

* * * * *